United States Patent
Moon

(10) Patent No.: US 6,291,360 B1
(45) Date of Patent: Sep. 18, 2001

(54) METHOD OF ETCHING A LAYER

(75) Inventor: Kyo-Ho Moon, Kyongsangbuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/265,784

(22) Filed: Mar. 10, 1999

(30) Foreign Application Priority Data

Mar. 26, 1998 (KR) .................................................. 98-10465

(51) Int. Cl.⁷ ................................................. H01L 21/302
(52) U.S. Cl. ........................ 438/725; 438/905; 438/906; 438/963; 134/1
(58) Field of Search ....................................... 438/706, 710, 438/725, 905, 906, 963; 134/1; 156/345, 643

(56) References Cited

U.S. PATENT DOCUMENTS 5,356,478 * 10/1994 Chen et al. ................................ 134/1
5,674,357 * 10/1997 Sun et al. ......................... 156/659.11
6,033,993 * 3/2000 Love, Jr. et al. ..................... 438/745

* cited by examiner

Primary Examiner—Benjamin L. Utech
Assistant Examiner—Kin-chan Chen
(74) Attorney, Agent, or Firm—Long Aldridge & Norman LLP

(57) ABSTRACT

The present invention relates to a method of etching a layer on a fabricated thin film transistor in liquid crystal display, which prevents failure of patterns by removing the residues generated from organic material in the air or the remainders of photoresist before patterning a layer. The present invention includes the steps of defining a photoresist pattern on a predetermined region of a layer on substrate, leaving an etch-resistant residue on at least a portion of the layer outside the predetermined region, removing residue by ashing with plasma, patterning the layer with an etchant, where the the photoresist pattern acts as an etch mask.

22 Claims, 3 Drawing Sheets

METHOD OF ETCHING A LAYER

This application claims the benefit of Korean Patent Application No. 98-10465, filed on Mar. 26, 1998, which is hereby incorporated by reference.

BACKGROUND OF THE INVENTION

1. Field of Invention

The present invention relates to a thin film transistor in a liquid crystal display and, more particularly, to a method of precisely etching a layer when fabricating a thin film transistor in liquid a crystal display.

2. Discussion of the Related Art

Figure 1A:
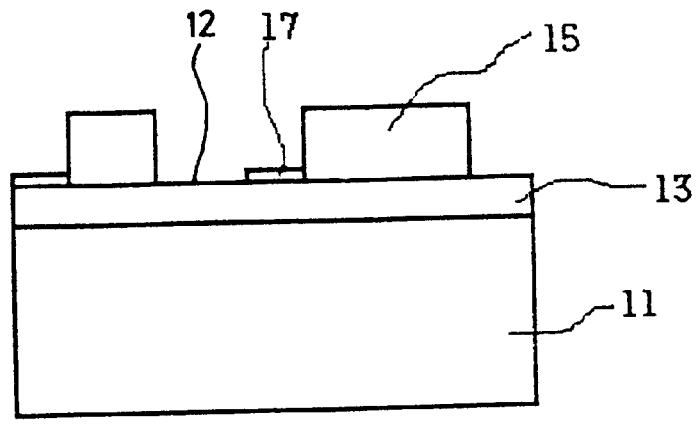
Figure 1B:
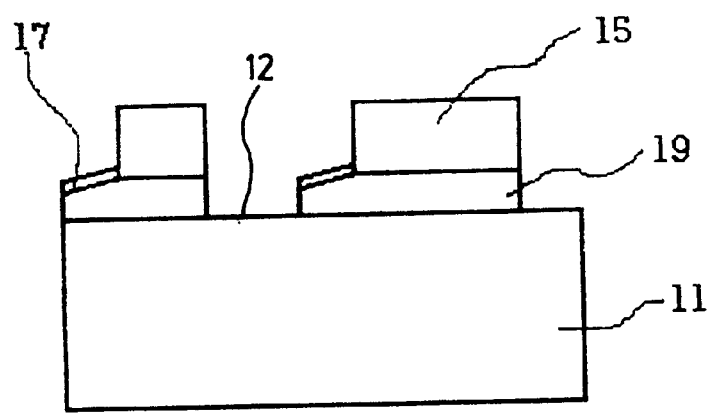
Figure 1C:
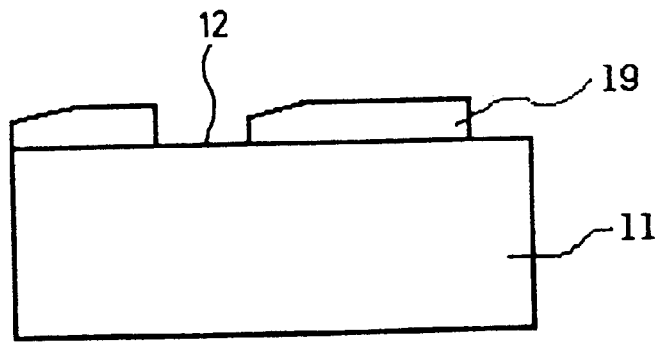

FIG. 1A to FIG. 1C show cross-sectional views of a method of etching a layer according to a related art.

Referring to FIG. 1A, a layer 13 is formed by depositing a material, for example amorphous silicon, polycrystalline silicon, metal, silicon oxide, silicon nitride or the like on a substrate 11 by conventional fabrication processes, for example by chemical vapor deposition (CVD) or sputtering. The substrate 11 may be one of a number of materials, for instance transparent glass, a wire or an insulating layer on glass. The layer has an exposed surface 12 opposite the surface in contact with the substrate 11.

The surface 12 of the layer 13 is coated with photoresist, and a photoresist pattern 15 is defined by exposure and development to cover a predetermined portion of the surface of the layer. Commonly, an etch-resistant residue 17 is left on the surface 12 of the layer 13 outside the predetermined region. The residue 17 can be an undesireable by-product of the photoresist definition process, or it may result from adhesion of materials not intentionally introduced into the process, such as organic material present in the atmosphere.

Referring to FIG. 1B, a patterned layer 19 is formed by pattering the surface of the layer not covered by photoresist. Patterning processes include wet etch and dry etch, also called plasma etch. In each case, the photoresist pattern 15 acts as an etch mask.

Referring to FIG. 1C, the photoresist pattern 15 remaining on the now-patterned layer 19 and the residue 17 are removed.

Unfortunately, the related art is unable to provide a precisely patterned layer, e.g., a layer where all regions of the layer outside the predetermined region have been etched away. The presence of the unetched residue acts as an unintentional etch mask, causing undesired layer pattern artifacts to occur. Accordingly, there is a need for a method of precisely and completely etching a layer which prevents unintentional pattern artifacts from occuring due to the presence of undesired residues.

SUMMARY OF THE INVENTION

The present invention is directed to a method of precisely and completely etching a layer that substantially obviates one or more of the problems due to limitations and disadvantages of the related art.

An object of the present invention is to provide a substantially residue-free etch surface in the area not intentionally covered by photoresist to allow precise etching of the desired pattern.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as in the appended drawings.

To achieve the objects and in accordance with the purpose of the invention, as embodied and broadly described herein, a method of etching a layer on a substrate includes the steps of defining a photoresist pattern on a predetermined region of the layer surface, wherein an etch-resistant residue is left on at least a portion of the layer surface outside the predetermined region, removing the residue by plasma ashing, and patterning the layer with an etchant where the photoresist pattern acts as an etch mask.

In another aspect of the invention, the method includes the steps of defining a photoresist pattern on a predetermined region of the layer surface, wherein an etch-resistant residue is left on at least a portion of the layer surface outside the predetermined region, removing the residue by plasma ashing in a system having a pressure lower than atmospheric pressure, and patterning the layer by plasma etching where the photoresist pattern acts as an etch mask. In this embodiment, the ash and etch steps are performed sequentially in the same pump-down in a plasma ash/etch system.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and, together with the description, serve to explain the principle of the invention.

Figure 2A:
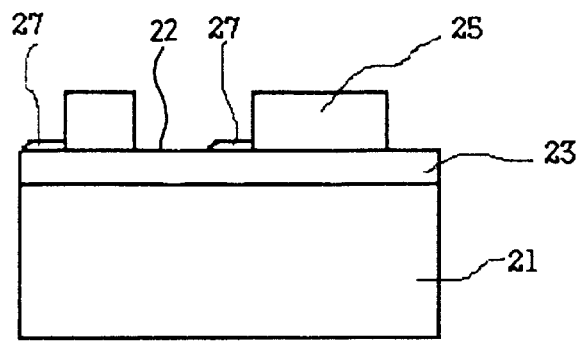
Figure 2B:
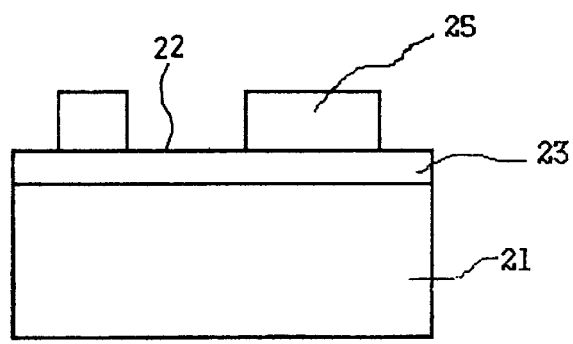
Figure 2C:
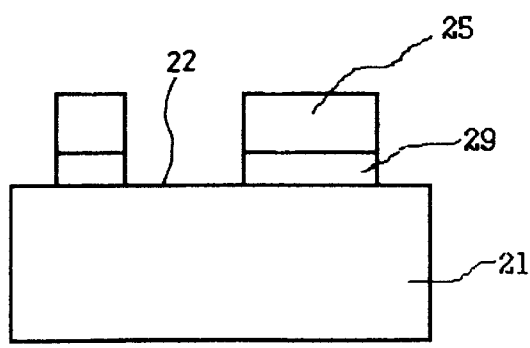
Figure 2D:
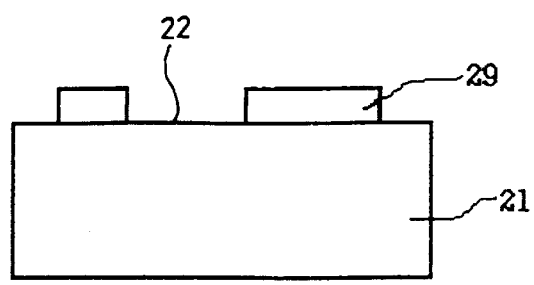
Figure 3A:
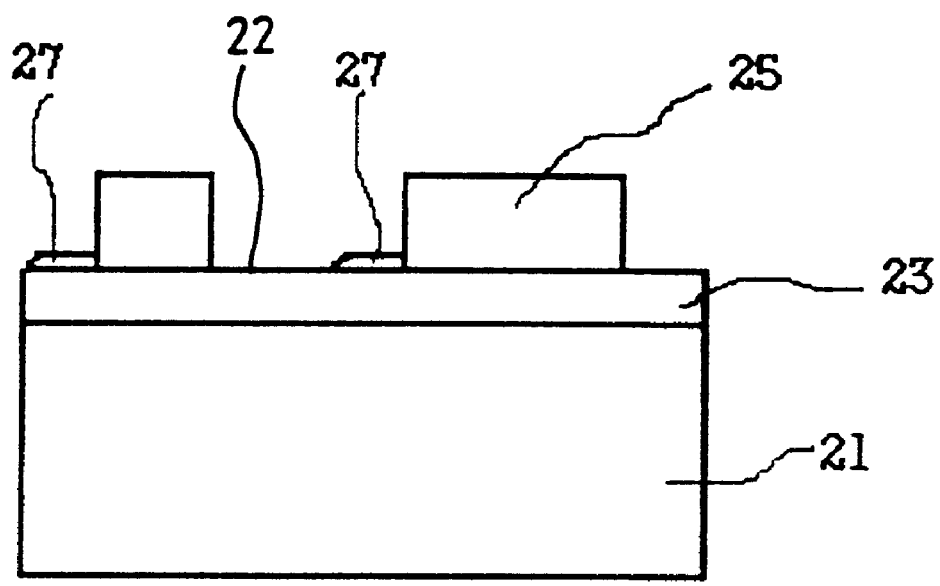
Figure 3B:
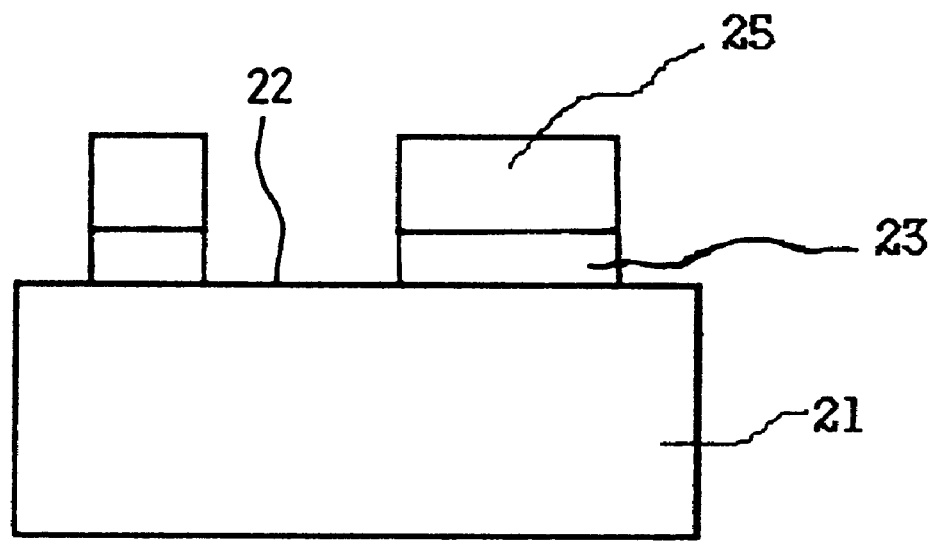

In the drawings:

FIGS. 1A, 1B, and FIG. 1C show cross-sectional views of a method of etching a layer according to a related art;

FIGS. 2A, 2B, 2C and FIG. 2D show cross-sectional views of an embodiment of a method of etching a layer according to the present invention; and FIG. 3A and FIG. 3B show cross-sectional views of another embodiment of a method of etching a layer according to the present invention.

DETAILED DESCRIPTION OF PREFERRED EMBODIMENTS

Reference will now be made in detail to the preferred embodiments of the present invention, examples of which are illustrated in the accompanying drawings.

FIGS. 2A to 2D show cross-sectional views of a method of etching a layer according to a first embodiment of the present invention.

Referring to FIG. 2A, a layer 23 such as amorphous silicon, polycrystalline silicon, metal, silicon oxide, silicon nitride or the like, has been deposited on a substrate 21 using a process such as CVD, sputtering or coating, or by coating the substrate 21 with an organic insulator material.

In this embodiment, the substrate 21 may be one of a number of materials, for example transparent glass, a wire or an insulating layer on glass. If the substrate 21 is a wire or an insulating layer on glass, the layer 23 to be etched is a material with a different etch ratio from that of the wire or the insulating layer.

A photoresist pattern 25 is defined by coating the surface 22 of the layer 23 with photoresist and exposing and developing the photoresist to cover a predetermined region of the surface of the layer. A residue 27, mainly including C, H and O, is commonly left on the surface 22 of the layer 23 outside the predetermined region. The residue 27 can be left by a number of mechanisms, for instance it may be an undesireable by-product of the photoresist definition process, or it may result from adhesion of materials not intentionally introduced into the process, such as organic materials present in the atmosphere.

Referring to FIG. 2B, the residue 27 is removed, preferably by ashing with a plasma having oxygen as a functional group in a gas. The organic material of the residue, the major components of which are C, H and 0, is oxidized to common oxidation by-products such as CO, $CO_2$, and $H_2O$ and the like, and is outgassed. Generally, the photoresist pattern 25 is also made of organic material, of which a portion may be unavoidably removed as well. Accordingly, the photoresist is preferably coaled at a thickness sufficient to leave at least a certain minimally-required thickness even after the ashing process.

For example, a positive photoresist, coated with a spinner at 1100~1250 RPM and cured at 125~140° C. for 150 sec to a final thickness of 1.3~1.8 μm, leaves a residue having thickness of smaller than 500 Å. Ashing in a plasma asher at 0.5~1.0 torr using gas containing $SF_6/O_2$ at 0~20/500~1000 SCCM lor 10~60 sec will remove substantially all of the residue and reduce the photoresist thickness to 1.2~1.7 μm. Photoresist at thickness 1.2~1.7 μm is sufficient to provide an etch mask for etching, for instance, a 2000~4000 Å $Si_3N_4$ film in an $H_3PO_4$ wet etch process without loss of photoresist adhesion or substantial occurrence of photoresist breakdown.

Referring to FIG. 2C, a patterned layer 29 is formed by pattering the surface 22 of the layer 23 where the photoresist pattern 25 acts as an etch mask. A number of patterning processes may be used, for instance wet etch or a dry etch including plasma etch. In this embodiment, precise and complete etching occurs in the region outside the masked region (the predetermined area) because this exposed etch surface is now free of any unetched or etch resistant residue. Thus the preferred embodiment inhibits inaccuracy of the desired pattern of the layer that occurs in conventional processes where the unetched or etch-resistant residue acts an unintentional etch mask, causing an undesired pattern artifact to appear in the layer.

When a patterned layer 29 is formed by a wet etch process, the layer 23 is etched by an appropriate chemical etchant, typically in liquid form in a tank that may be heated. Metal layers are preferably etched by a mixed etchant solution of $H_3PO_4$, $HNO_3$ and HF. Amorphous silicon or polycrystalline silicon layers are preferably etched by an etchant solution of $HNO_3$ and HF. Silicon oxide layers are preferably etched by an HF etchant. Silicon nitride layers are preferably etched by an $H_3PO_4$ etchant. Although the primary functional components of the etchants have been described, it will be appreciated by those of ordinary skill in the art that the etch baths may variously include buffers, surfactants and other additives.

When a patterned layer 29 is formed by a dry etch process, the layer 23 is etched by an appropriate etchant, typically a gas. Metal layers are preferably etched by HBr, $CH_4$, HCl, $Cl_2$, $BCl_3$, HI or the like. Amorphous silicon, microcrystalline silicon, polycrystalline silicon, silicon nitride, silicon oxide or organic insulator layers are preferably etched by a gas or a mixed gas which has fluorine as a functional group, for example, $SF_6$, $CF_4$, etc.

Referring to FIG. 2D, removal of the photoresist leaves the patterned layer 29 only in the predetermined region.

FIGS. 3A to 3B show cross-sectional views of a method of etching a layer according to a second embodiment of the present invention.

Referring to FIG. 3A, a layer 23 such as amorphous silicon, polycrystalline silicon, metal, silicon oxide, silicon nitride or the like, has been deposited on a substrate 21 using a process such as CVD, sputtering or coating, or by coating the substrate 21 with an organic insulator material.

A photoresist pattern 25 is defined by coating the surface 22 of the layer 23 with photoresist and exposing and developing the photoresist to cover a predetermined region the surface of the layer. A residue 27, mainly including C, H and O, is commonly left on the surface 22 of the layer 23 outside the predetermined region. The residue 27 may be an undesireable by-product of the photoresist definition process, or it may result from adhesion of materials not intentionally introduced into the process, such as organic material present in the atmosphere.

Referring to FIG. 3B, the residue 27 is removed, preferably by ashing with a plasma having oxygen as a functional group in a gas. The organic material of the residue, the major components of which are C, H and O, is oxidized to common oxidation by-products such as CO, $CO_2$, and $H_2O$ and the like and is outgassed. Generally, the photoresist pattern 25 is also made of organic material, of which a portion may be unavoidably removed as well. Accordingly, the photoresist is preferably coated at a thickness sufficient to leave at least a certain minimally-required thickness even after the ashing process.

A patterned layer is then formed by pattering the surface of the layer not covered by the photoresist. A patterning process such as dry etch, also called plasma etch, is preferably used, and the photoresist pattern 25 acts as an etch mask.

In a preferred embodiment, the step of removing the residue 27 and the step of layer patterning by dry etch are carried out one after another in a plasma etching/ashing system. In certain embodiments, the system has a single process chamber which is pumped-down below atmospheric pressure. Ashing is performed in this chamber by admitting the appropriate gas, as previously described. Then, without exposing the process chamber to air, in other words, in the same pump-down, the layer patterning step is performed using the photoresist pattern 25 as an etch mask. In this embodiment, precise and complete etching occurs in the region outside the masked region (in other words, outside the predetermined area) because this etch surface is now free of any etch-resistant or unetched residue. Thus, the preferred embodiment inhibits inaccuracy in the desired pattern of the layer that occurs in conventional processes where the etch resistant residue acts as an unintentional etch mask, causing an undesired pattern artifact to occur in the layer. Further, pattern inaccuracies introduced by other modes, such as particles and other contaminants in the air, are reduced because the etch process follows the ash process in the same chamber during the same pump-down without returning the system to atmosphere and thus risking exposure to air contaminants.

In certain embodiments, a small amount of etchant gas is introduced into the ashing gas near the end of the ash step. The relative percent of etchant gas is then increased and the corresponding percent of ashing gas is decreased as the method proceeds to the etching step. Accordingly, after the residue 27 has been ashed, the step of patterning (dry etching) the layer 23 may proceed by the etchant gas in a continuous fashion without interruption.

The photoresist pattern may then be removed, as shown in FIG. 2D resulting in the patterned layer 29.

Accordingly, the present invention provides a substantially residue-free etch surface in the area not intentionally covered by photoresist to allow precise etching of the desired pattern and prevents unintentional pattern artifacts from occurring due to the presence of undesired residues.

It will be apparent to those skilled in the art that various modifications and variations can be made in a method of patterning a layer of the present invention without departing from the spirit or scope of the inventions. Thus, it is intended that the present invention covers the modifications and variations of this invention provided they come within the scope of the appended claims and equivalents.

What is claimed is:

1. A method of etching a layer on a substrate, comprising the steps of:
   defining a photoresist pattern on a region of a surface of the layer, wherein a residue of photoresist is left on at least a portion of the layer surface outside the region;
   removing the residue by plasma ashing; and
   patterning the layer with an etchant using the photoresist pattern as an etch mask;
   wherein the removing step and the patterning step are preformed without exposing the layer to the air.

2. The method of etching a layer according to claim 1, wherein following the step of layer patterning, the method further comprises the sleep of removing the photoresist.

3. The method of etching a layer according to claim 1, wherein the substrate includes glass.

4. The method of etching a layer according to claim 1, wherein the substrate is selected from the group consisting of conductive wire and material coated with an insulator.

5. The method of etching a layer according to claim 1, wherein the layer is selected from the group consisting of amorphous silicon, microcrystalline silicon, polycrystalline silicon, metal, silicon oxide and silicon nitride.

6. The method of etching a layer according to claim 1, wherein the layer is a material having a selective etch ratio different from that of the substrate.

7. The method of etching a layer according to claim 1, wherein the residue is a by-product of the photoresist defining step.

8. The method of etching a layer according to claim 1, wherein the residue is left by adhered organic material unintentionally introduced into the process.

9. The method of etching a layer according to claim 1, wherein the residue is removed by an oxidizing plasma having an oxygen functional group in a gas.

10. The method of etching a layer according to claim 1, wherein the step of patterning is a process selected from the group consisting of wet etch and dry etch.

11. A method of etching a layer on a substrate, comprising the steps of:
    defining a photoresist pattern on a region of a surface of the layer, wherein a residue is left on at least a portion of the layer surface outside the region;
    removing the residue by plasma ashing in a system having a pressure lower than atmospheric pressure; and
    patterning the layer by etching using the photoresist pattern as an etch mask, and wherein the pressure of the residue removal step is maintained during the layer patterning step.

12. The method of etching a layer according to claim 11, wherein following the layer patterning step, the method further comprises the step of allowing the system to return to atmospheric pressure.

13. The method of etching a layer according to claim 12, wherein following the step of allowing the system to return to atmospheric pressure, the method further comprises the step of removing the photoresist.

14. The method of etching a layer according to claim 11, wherein following the patterning step, the method further comprises the step of removing the photoresist.

15. The method of etching a layer according to claim 11, wherein the residue is a by-product of the photoresist defining step.

16. The method of etching a layer according to claim 11, wherein the residue is left by adhered organic material unintentionally introduced into the process.

17. The method of etching a layer according to claim 11, wherein the residue is removed by an oxidizing plasma having an oxygen functional group in a gas.

18. The method of etching a layer according to claim 17, wherein the gas further includes a plasma etchant.

19. The method of etching a layer according to claim 18, wherein the steps of removing the residue with an ashing gas and patterning the layer with an etching gas are performed sequentially in a process chamber without returning the chamber to atmospheric pressure between the steps.

20. The method of etching a layer according to claim 19, wherein following the plasma ashing step and preceding the patterning step, the method further includes the step of decreasing the partial pressure of the ashing gas while simultaneously increasing the partial pressure of the etching gas until the partial pressure of the ashing gas is substantially close to zero.

21. A method of forming a patterned layer on a substrate for a thin film transistor for a liquid crystal display, the method comprising the steps of:
    forming a layer to be etched on the substrate, the layer having a selective etch ratio different from that of the substrate;
    defining a photoresist pattern on a region of a surface of the layer, a residue of the photoresist remaining on at least a portion of the layer surface outside the region, the residue being a by-product of the photoresist defining step or an adhered organic material unintentionally introduced into the process;
    removing the residue by plasma ashing;
    etching the layer using the photoresist pattern as an etch mask to form the patterned layer; and
    removing the photoresist pattern;
    wherein the residue is removed and the etching step occurs in the same chamber without exposing the layer to the air.

22. A method for forming a patterned layer overlying a transparent substrate comprising the steps of:
    providing a transparent substrate;
    forming a conducting layer overlying the substrate;
    forming a photoresist pattern overlying the conducting layer, the pattern having a thickness greater than approximately 1.0 micron;
    placing the substrate in a chamber;
    removing photoresist debris by plasma ashing the chamber at approximately 0.5 torr to approximately 1.0 torr using gas containing oxygen for approximately 10 seconds to approximately 60 seconds; and
    plasma etching the layer using the pattern as a mask in the chamber, without exposing the layer to the atmosphere between and during the removing and plasma etching steps.

* * * * *